(12) United States Patent
Shih et al.

(10) Patent No.: US 11,720,025 B2
(45) Date of Patent: Aug. 8, 2023

(54) EXTREME ULTRAVIOLET LITHOGRAPHY METHOD, EXTREME ULTRAVIOLET MASK AND FORMATION METHOD THEREOF

(71) Applicant: TAIWAN SEMICONDUCTOR MANUFACTURING CO., LTD., Hsinchu (TW)

(72) Inventors: Chih-Tsung Shih, Hsinchu (TW); Yu-Hsun Wu, New Taipei (TW); Bo-Tsun Liu, Taipei (TW); Tsung-Chuan Lee, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/848,139

(22) Filed: Jun. 23, 2022

(65) Prior Publication Data

US 2022/0326598 A1    Oct. 13, 2022

Related U.S. Application Data

(62) Division of application No. 16/900,384, filed on Jun. 12, 2020, now Pat. No. 11,392,022.

(51) Int. Cl.
*G03F 7/20*    (2006.01)
*G03F 1/24*    (2012.01)

(52) U.S. Cl.
CPC .............. *G03F 7/2004* (2013.01); *G03F 1/24* (2013.01)

(58) Field of Classification Search
CPC ................................. G03F 1/24; G03F 7/2004
USPC .............................................................. 430/5
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2022/0326597 A1* | 10/2022 | Lin ....................... G03F 7/2008 |

* cited by examiner

*Primary Examiner* — Christopher G Young
(74) *Attorney, Agent, or Firm* — Birch, Stewart, Kolasch & Birch, LLP

(57) ABSTRACT

A method of forming an extreme ultraviolet (EUV) mask includes forming a multilayer Mo/Si stack comprising alternating stacked Mo and Si layers over a mask substrate; forming a ruthenium capping layer over the multilayer Mo/Si stack; doping the ruthenium capping layer with a halogen element, a pentavalent element, a hexavalent element or combinations thereof; forming an absorber layer over the ruthenium capping layer; and etching the absorber layer to form a pattern in the absorber layer.

20 Claims, 17 Drawing Sheets

EXTREME ULTRAVIOLET LITHOGRAPHY METHOD, EXTREME ULTRAVIOLET MASK AND FORMATION METHOD THEREOF

CROSS-REFERENCE TO RELATED APPLICATION

This application is divisional application of U.S. application Ser. No. 16/900,384, filed Jun. 12, 2020, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
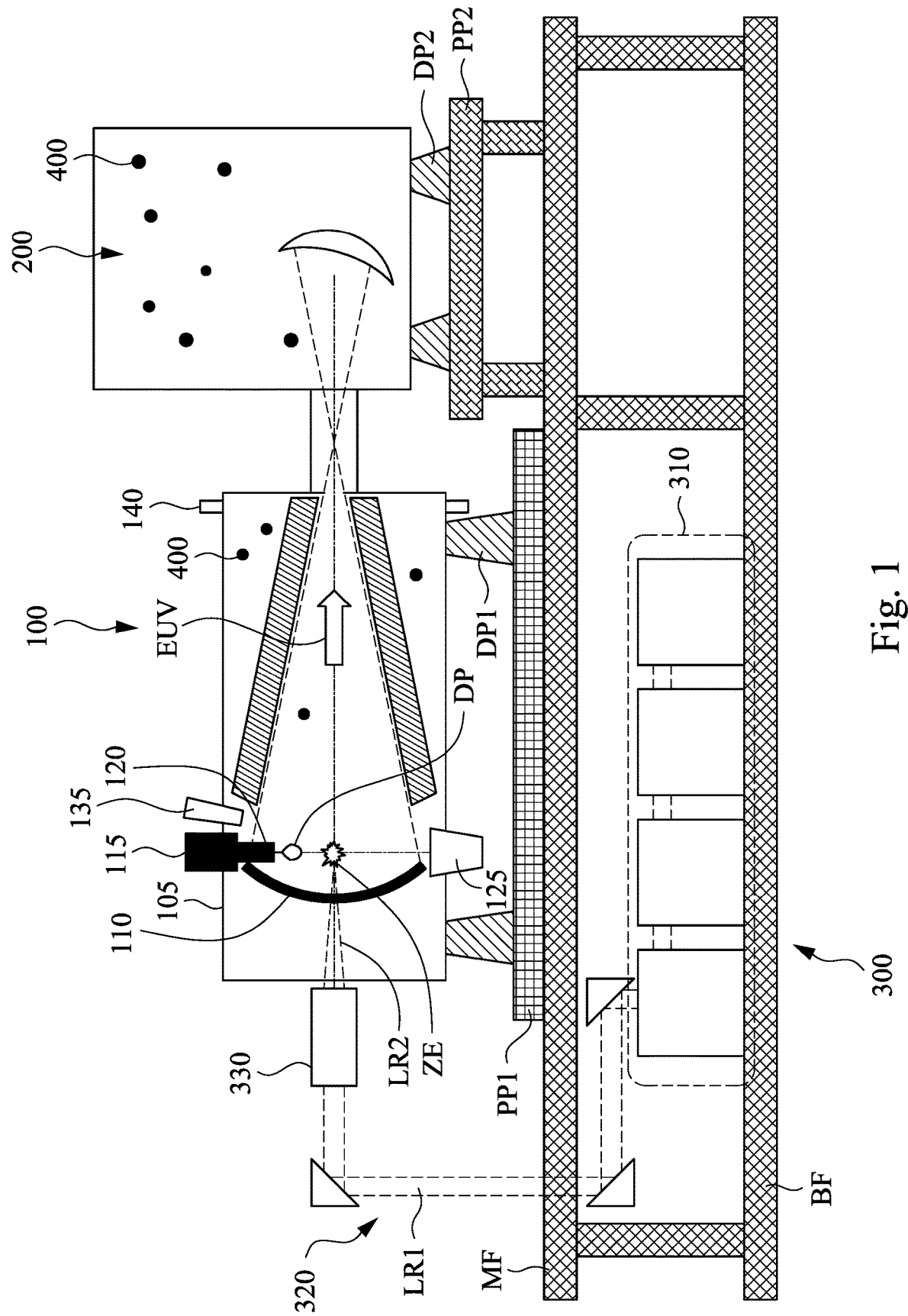
FIG. 1 is a schematic view of an EUV lithography tool with an LPP-based EUV radiation source, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in contact, and may also include embodiments in which additional features may be formed between the first and second features, such that the first and second features may not be in contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

To address the trend of the Moore's law for decreasing size of chip components and the demand of higher computing power chips for mobile electronic devices such as smart phones with computer functions, multi-tasking capabilities, or even with workstation power. Smaller wavelength photolithography exposure systems are desirable. Extreme ultraviolet (EUV) photolithography technique uses an EUV radiation source to emit an EUV light ray with wavelength of about 13.5 nm. Because this wavelength is also in the x-ray radiation wavelength region, the EUV radiation source is also called a soft x-ray radiation source. The EUV light rays emitted from a laser-produced plasma (LPP) are collected by a collector mirror and reflected toward a patterned mask.

FIG. 1 is a schematic view of an EUV lithography tool with an LPP-based EUV radiation source, in accordance with some embodiments of the present disclosure. The EUV lithography system includes an EUV radiation source 100 to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor MF. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 2:
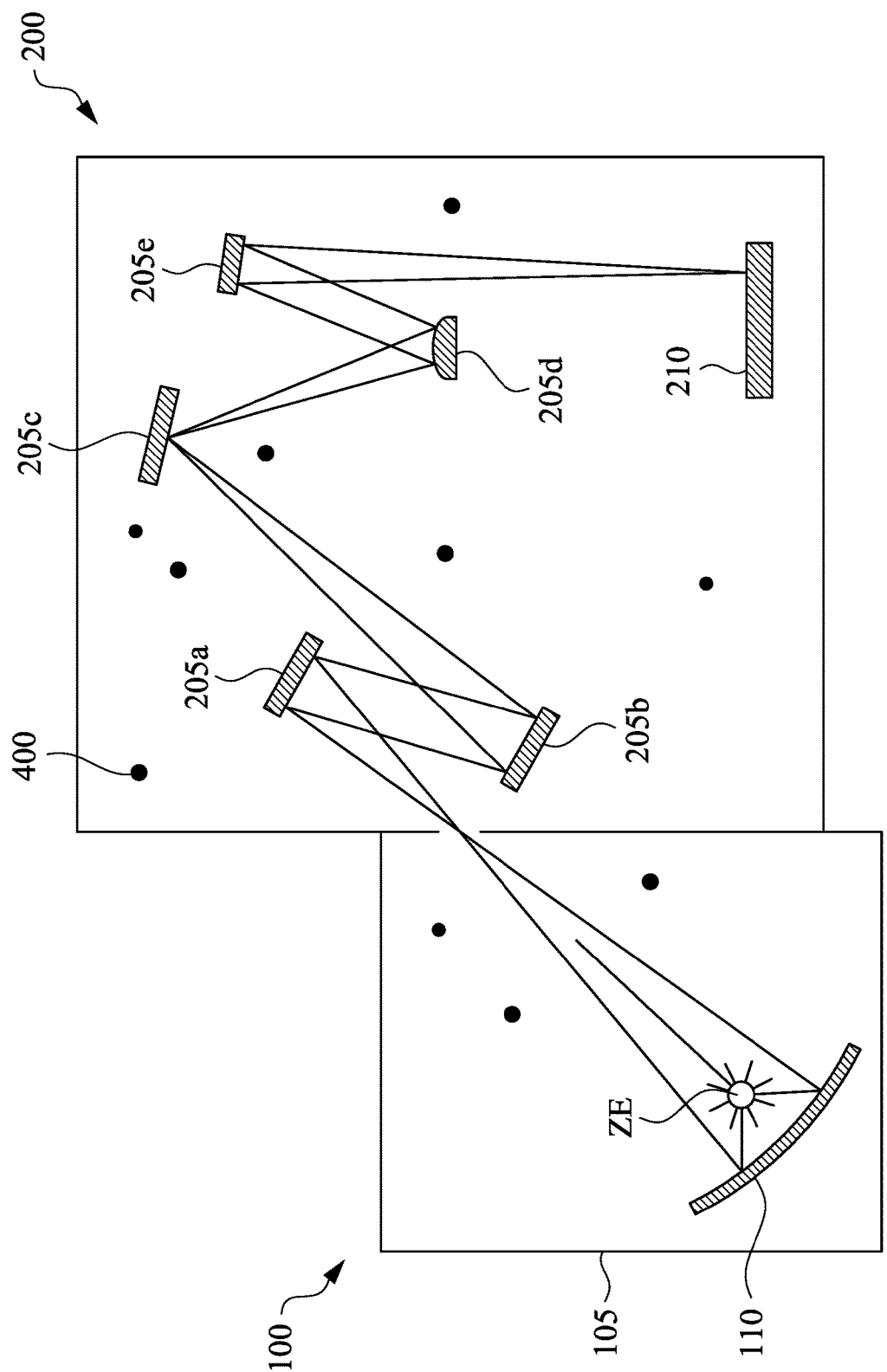
FIG. 2 is a simplified schematic diagram of a detail of an extreme ultraviolet lithography tool according to an embodiment of the disclosure showing the exposure of photoresist coated substrate with a patterned beam of EUV light.

FIG. 2 is a simplified schematic diagram of a detail of an extreme ultraviolet lithography tool according to an embodiment of the disclosure showing the exposure of photoresist coated substrate 210 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIG. 2, the EUVL tool includes an EUV light source 100 including an EUV light radiator ZE emitting EUV light in a chamber 105 that is reflected by a collector 110 along a path into the exposure device 200 to irradiate the substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is directed to, but not limited to, components which operate solely or to advantage within one or more specific wavelength range(s) such as at the EUV output light wavelength, the irradiation laser wavelength, a wavelength suitable for metrology or any other specific wavelength.

Because gas molecules absorb EUV light, the lithography system for the EUV lithography patterning is maintained in a vacuum or a low pressure environment to avoid EUV intensity loss. However, hydrocarbon-containing gases exist in a vacuum or a low pressure environment. Therefore, in reality, in the EUV lithography system, a presence of adventitious gaseous organic compound 400 (interchangeably referred to as hydrocarbon-containing gas) is inevitably present in the exposure device 200 and the chamber 105.

In the present disclosure, the terms mask, photomask, and reticle are used interchangeably. In the present embodiment, the patterning optic 205c is a reflective mask. In an embodiment, the reflective mask 205c includes a substrate with a suitable material, such as a low thermal expansion material or fused quartz. In various examples, the material includes $TiO_2$ doped $SiO_2$, or other suitable materials with low thermal expansion. The reflective mask 205c includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configured to highly reflect the EUV light. The mask 205c may further include a capping layer, having a top portion made of a metal element and at least one nonmetal element, disposed on the ML for minimizing oxidation of the ML. The mask further includes an absorption layer (interchangeably referred to as absorber layer), such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

In various embodiments of the present disclosure, the photoresist coated substrate 210 is a semiconductor wafer, such as a silicon wafer or other type of wafer to be patterned.

The EUVL tool further includes other modules or is integrated with (or coupled with) other modules in some embodiments.

As shown in FIG. 1, the EUV radiation source 100 includes a target droplet generator 115 and a LPP collector 110, enclosed by a chamber 105. In various embodiments, the target droplet generator 115 includes a reservoir to hold a source material and a nozzle 120 through which target droplets DP of the source material are supplied into the chamber 105.

In some embodiments, the target droplets DP are droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz).

Referring back to FIG. 1, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser generator 310 has a wavelength of about 9.4 μm or about 10.6 μm, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with (e.g., synchronized with) the ejection-frequency of the target droplets DP in an embodiment.

The excitation laser LR2 is directed through windows (or lenses) into the zone of excitation ZE. The windows are made of a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

In some embodiments, the collector 110 is designed with a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In such an EUV radiation source, the plasma caused by the laser application creates dissociation of gaseous organic compound 400. For example, during the EUV lithography, the gaseous organic compound 400 tends to be negatively charged. The negatively charged gaseous organic compound 400 would cross-link undesirably with the Ru material in the capping layer in the reflective mask 205*c*, which in turn leads to carbon unwantedly deposited on the capping layer, thus degrading the critical dimension (CD) of the resulting pattern formed on the photoresist-coated substrate 21. Embodiments of the present disclosure provide an improved composition for the capping layer so as to prevent the dissociated gaseous organic compound from cross-linking with the Ru material in the capping layer.

FIGS. 3A, 3B, 3C and 3D are cross-sectional views of various stages of a process for forming an extreme ultraviolet (EUV) mask 6 in accordance with some embodiments. It is understood that additional operations can be provided before, during, and after processes shown by FIGS. 3A, 3B, 3C and 3D and some of the operations described below can be replaced or eliminated, for additional embodiments of the method. The order of the operations/processes may be interchangeable.

Figure 3A:
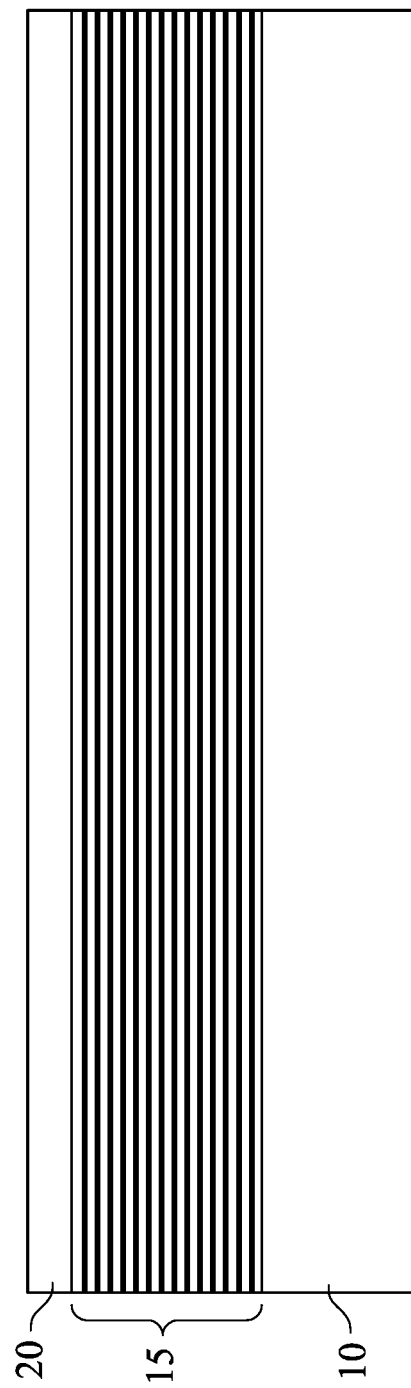
FIGS. 3A, 3B, 3C and 3D are cross-sectional views of various stages of a process for forming an extreme ultraviolet (EUV) mask in accordance with some embodiments.

Reference is made to FIG. 3A. A multilayer Mo/Si stack 15 of multiple alternating layers of silicon and molybdenum and a capping layer 20 are formed over a substrate 10 in sequence.

The substrate 10 is formed of a low thermal expansion material in some embodiments. In some embodiments, the substrate 10 is a low thermal expansion glass or quartz, such as fused silica or fused quartz. In some embodiments, the low thermal expansion glass substrate transmits light at visible wavelengths, a portion of the infrared wavelengths near the visible spectrum (near-infrared), and a portion of the ultraviolet wavelengths. In some embodiments, the low thermal expansion glass substrate absorbs extreme ultraviolet wavelengths and deep ultraviolet wavelengths near the extreme ultraviolet.

In some embodiments, the Mo/Si multilayer stack 15 includes from about 30 alternating layers each of silicon and molybdenum to about 60 alternating layers each of silicon and molybdenum. In some embodiments, the silicon and molybdenum layers are formed by chemical vapor deposition (CVD), plasma-enhanced CVD (PECVD), atomic layer deposition (ALD), physical vapor deposition (PVD) (sputtering), or any other suitable film forming method. In some embodiments, the layers of silicon and molybdenum are about the same thickness. In other embodiments, the layers of silicon and molybdenum are different thicknesses.

The capping layer 20 is disposed over the multilayer Mo/Si stack 15 to prevent oxidation of the multilayer Mo/Si stack 15 during a mask patterning process and an absorber layer repairing process. In addition, the capping layer 20 acts as an etch stop in an absorber layer patterning process. In some embodiments, the capping layer 20 is formed by chemical vapor deposition (CVD), plasma-enhanced chemical vapor deposition (PECVD), atomic layer deposition (ALD), physical vapor deposition (PVD), or any other suitable film forming method. The capping layer 20 has a first composition. In some embodiments, the first composition includes one pure metal element, which has metallic bonds, such as a transition metal. For example, the first composition includes ruthenium (Ru).

Figure 3B:
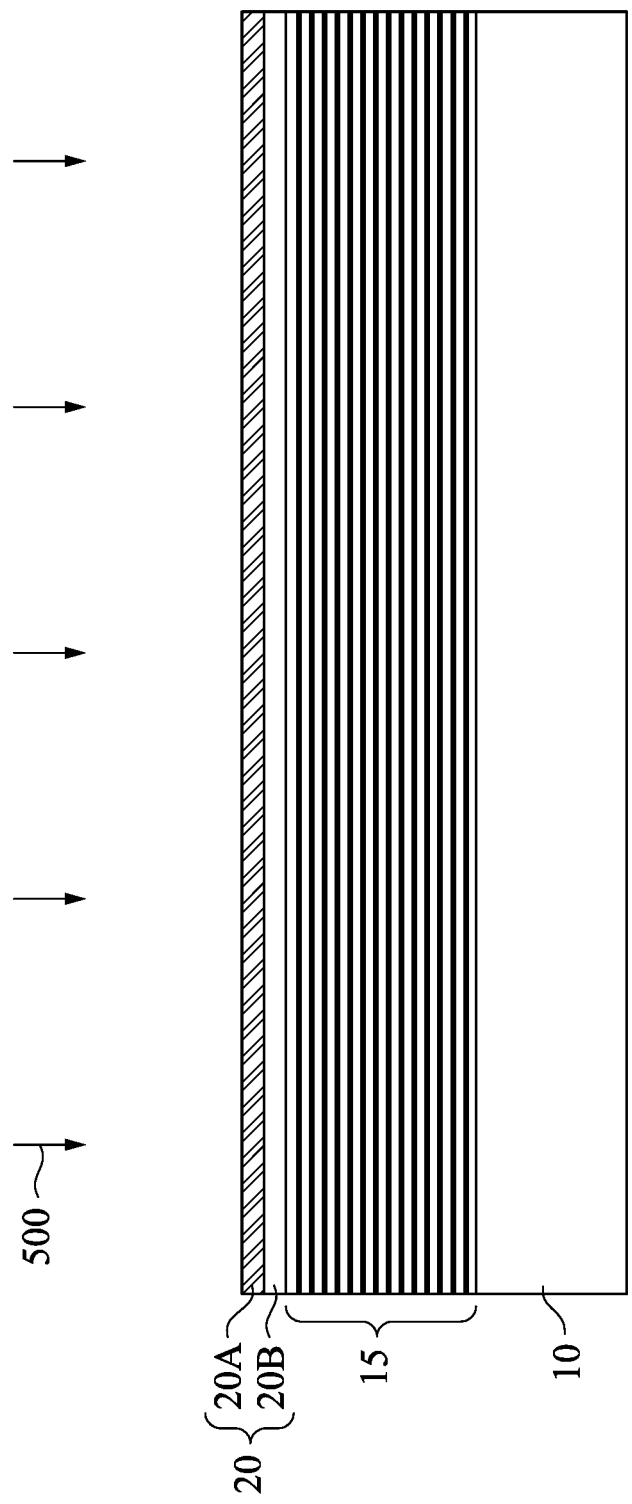

Reference is made to FIG. 3B. A doping process 500 is performed on the capping layer 20 to dope a top portion of the capping layer 20 with a dopant to form a doped top portion 20A. A bottom portion 20B of the capping layer 20 may remain un-doped or has a lower dopant concentration than the top portion 20A. The doping process 500 may include ion implantation and/or other suitable processes. In some embodiments, the dopant includes at least one nonmetal element that has high electronegativity difference from ruthenium. For example, the dopant (interchangeably referred to as impurity) is a halogen element (e.g., fluorine, chlorine or the like), a pentavalent element (nitrogen or the like), or a hexavalent element (oxygen or the like). Precursors of the fluorine element may include fluorine-containing gas. By way of example and not limitation, the fluorine-containing gas may be $GeF_4$, $NF_3$, $CF_4$, $C_2F_6$, $F_2$, the like, or mixtures thereof. Precursors of the chlorine element may include chlorine-containing gas. By way of example and not limitation, the chlorine-containing gas may include $Cl_2$, $CHCl_3$, $CCl_4$, $BCl_3$, the like, or mixtures thereof. Precursors of the pentavalent element (nitrogen or the like) may include nitrogen-containing gas. By way of example and not limitation, the nitrogen-containing gas may include ammonia ($NH_3$), dimethyl amine ($N(CH_3)_2$), dimethyl amine ($N(C_2H_5)_2$), the like, or mixtures thereof. Precursors of the hexavalent element (oxygen or the like) may include oxygen-containing gas. By way of example and not limitation, the oxygen-containing gas includes $H_2O$, $D_2O$, $O_3$, $O_2$, the like, or mixtures thereof.

Once the doping process 500 is complete, the doped top portion 20A has a second composition different from the first composition of the substantially un-doped bottom portion 20B. A molecular weight of the second composition is greater than a molecular weight of the first composition. In some embodiments, the second composition includes the metal element and the doped impurity (e.g., halogen impurity, pentavalent impurity or hexavalent impurity). In particular, the second composition and the first composition have different chemical bonding types. In some embodiments where the first composition includes a transition metal, since the transition metal has a tendency to accept electrons, the doped impurity may react with the transition metal to form a stable coordination complex. In some embodiments where the first composition includes ruthenium, the second composition may include at least one ruthenium complex, such as $Ru_xO_{1-x}$, $Ru_xN_{1-x}$, $Ru_xA_yO_{1-x-y}$ (where A is a halogen atom), or the like. Stated differently, the second composition includes a ruthenium complex with a ligand having a halogen element, a pentavalent element, a hexavalent element or combinations thereof. The ruthenium forms chemical bonds (e.g., ionic bonds for halogen element) having high electronegativity difference with the halogen element, pentavalent element or hexavalent element, which in turn places ruthenium in a stable state with a valence number of 16 or 18. Since the halogen element, pentavalent element or hexavalent element may fill electron vacancy in ruthenium, the unwanted cross-link between the adventitious gaseous organic compound 400 in the EUV lithography system and the doped top portion 20A of the capping layer 20 may be prevented, which will be described in greater detail below.

Figure 3C:
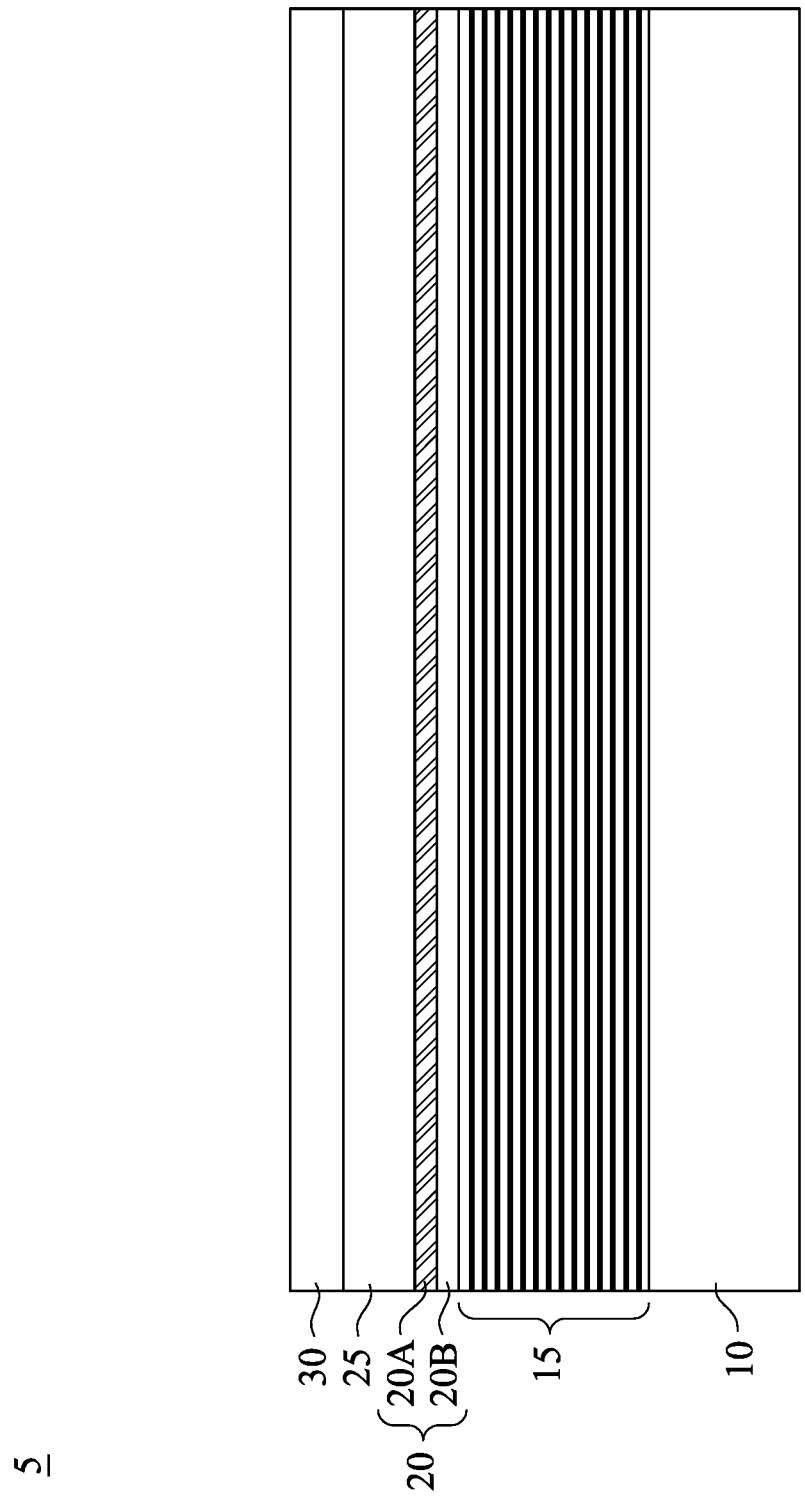

Reference is made to FIG. 3C. An absorber layer 25 is disposed over the capping layer 20. An anti-reflection layer 30 is disposed over the absorber layer 25. Thus, an EUV photo mask blank 5 is formed. In some embodiments, the absorber layer 25 is a Ta-based material. In some embodiments, the absorber layer 25 is made of TaN and/or TaBN. In some embodiments, the absorber layer 25 is formed by chemical vapor deposition, plasma-enhanced chemical vapor deposition, atomic layer deposition, physical vapor deposition, or any other suitable film forming method. The anti-reflection layer 30 is formed of a material including $SiO_2$, SiN, TaBO, $TaO_5$, $Cr_2O_3$, ITO (indium tin oxide), or any suitable material, in some embodiments of the present disclosure. The anti-reflection layer 30 reduces reflections of photolithographic radiation.

Figure 3D:
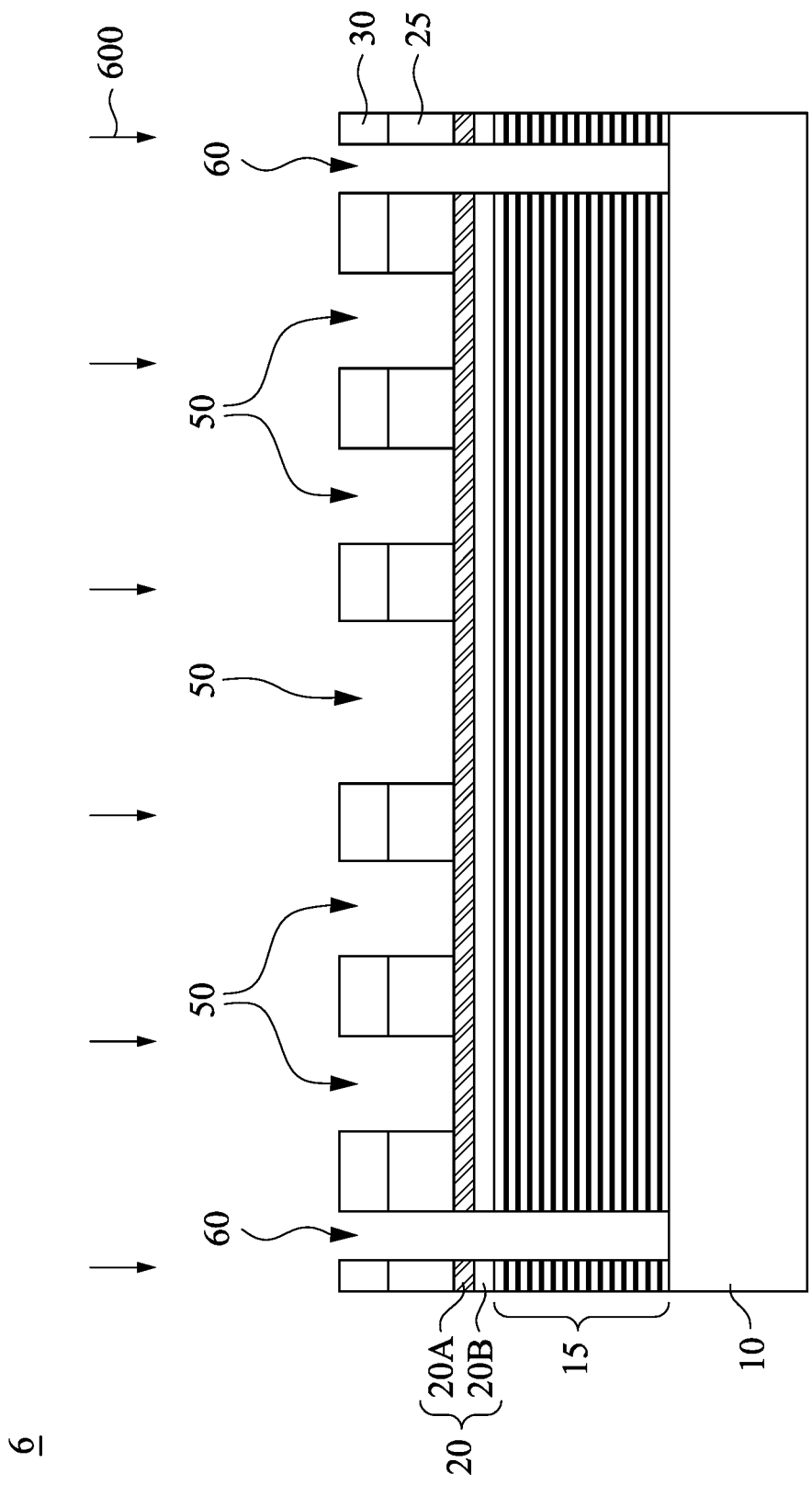

Reference is made to FIG. 3D. One or more circuit patterns 50 are formed on the EUV photo mask blank 5 (see FIG. 3C) by performing an etching step 600 to pattern the absorber layer 25 and the anti-reflection layer 30. Thus, an EUV mask 6 is formed. The EUV mask 6 is a reflective mask, and the Mo/Si multilayer stack 15 reflects the EUV light, while the absorber layer 25 absorbs the EUV light. During the patterning, the absorber layer 25 and the anti-reflection layer 30 are partially removed. For example, the absorber layer 25 is etched to expose the doped top portion 20A of the capping layer 20. In addition, a black border area 60 surrounding a circuit pattern region and penetrating to the substrate 10 is formed. The circuit patterns 50 are formed by using one or more lithography (e.g., electron beam lithography) and etching operations. In some examples, the area in which no circuit pattern is formed is covered by an absorber layer 25 so that the EUV light is not reflected.

Figure 4A:
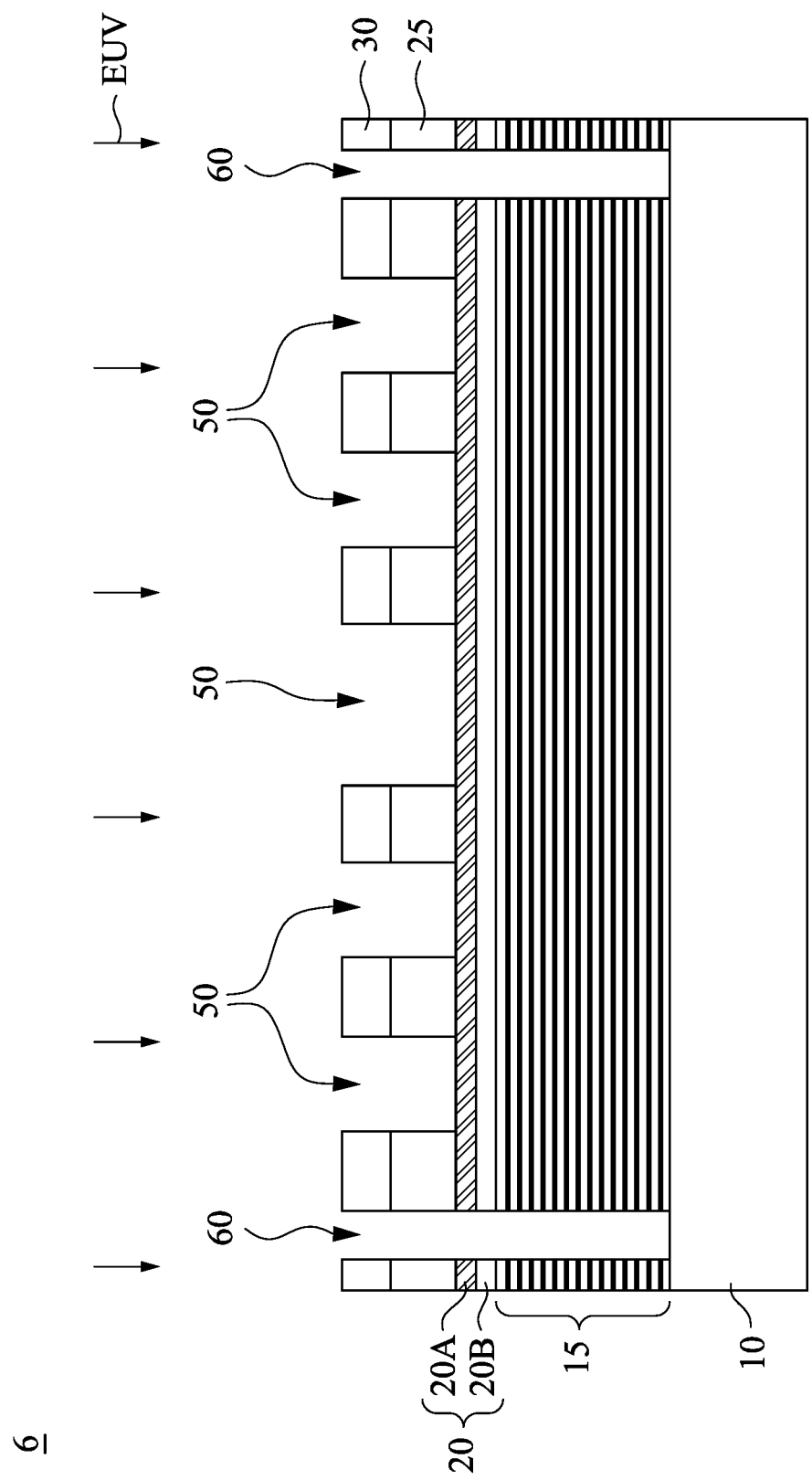
FIG. 4A is a cross-sectional view of the extreme ultraviolet (EUV) mask under exposure of the EUV radiation in accordance with some embodiments.
Figure 4B:
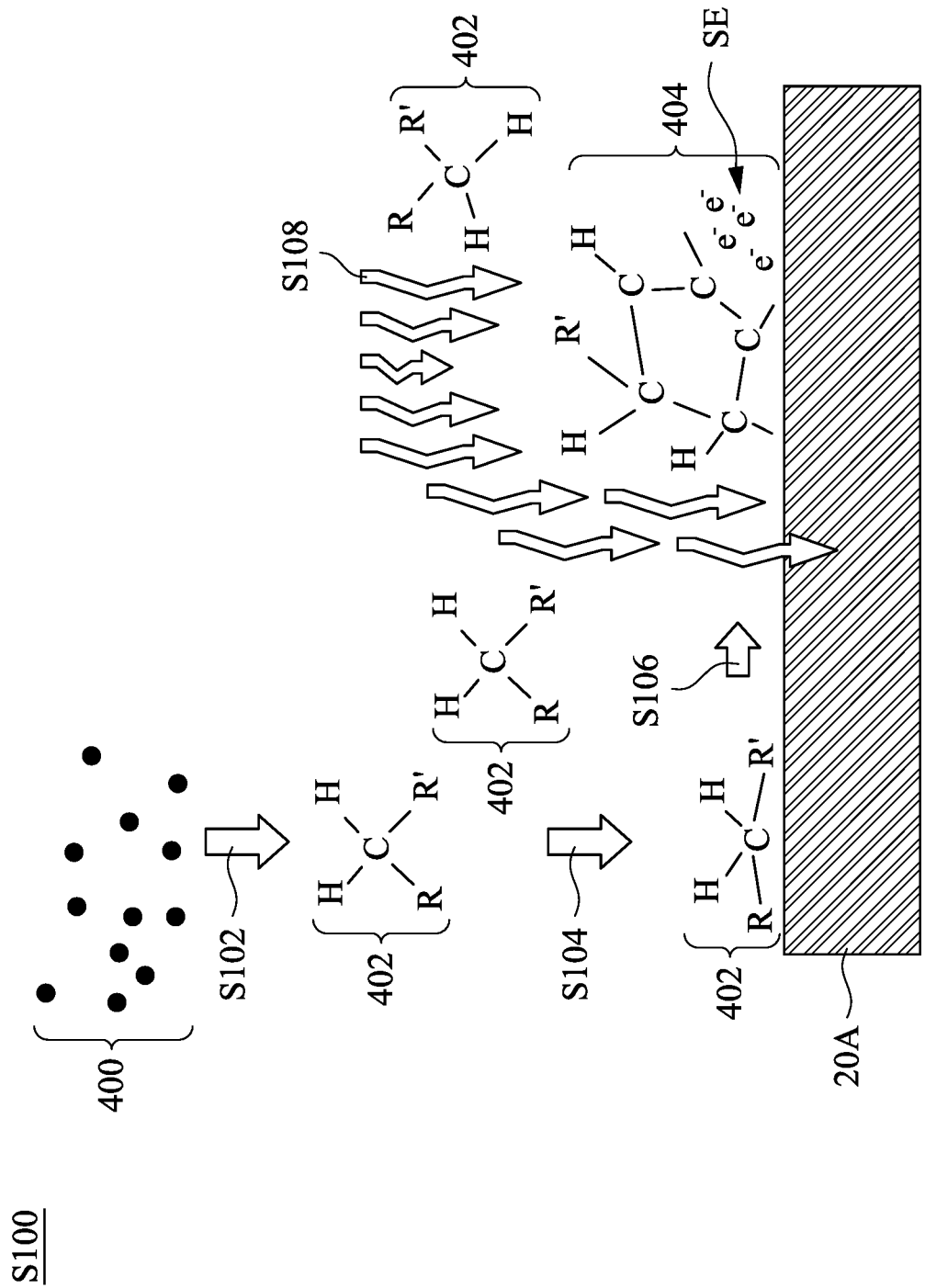
FIG. 4B is a diagram illustrating a mechanism of hydrocarbon from a gaseous organic compound deposition on the EUV mask.

FIGS. 4A and 4B illustrates how cross-link occurs on the Ru capping layer during the EUV lithography process, if the capping layer is free of the halogen element, the pentavalent element or the hexavalent element. FIG. 4A is a cross-sectional view of the EUV mask 6 under exposure of the EUV radiation in accordance with some embodiments. FIG. 4B is a diagram illustrating a mechanism S100 of hydrocarbon formed from a gaseous organic compound deposited on the doped top portion 20A of the capping layer 20 of the EUV mask 6 in FIG. 4A. Reference is made to FIGS. 4A and 4B. For the sake of clarity, steps of the mechanism S100 are labeled as S102, S104, S106, and S106. As illustrated, the EUV radiation is incident on the EUV mask 6. In step S102, the EUV radiation induces a dissociation of the gaseous organic compound 400 such as hydrocarbons to form hydrocarbon fragments 402. The hydrocarbon fragments 402 are not a cross-linked structure. Therefore, the hydrocarbon fragments 402 are dissociable to EUV radiation and a majority of the hydrocarbon fragments 402 does not tend to be deposited on the surface of the doped top portion 20A. In some embodiments, a minority of the hydrocarbon fragment 402 may be deposited on the surface of the doped top portion 20A. For example, in step S104, the hydrocarbon fragments may absorb on the surface of the doped top portion 20A of the capping layer 20. Then, in step S106, the hydrocarbon fragments 402 diffuse along the surface of the doped top portion 20A. Undesirable cross-link structures 404 formed of cross-link between the hydrocarbon fragments 402 and the doped top portion 20A of the capping layer (step S108) caused by secondary electrons SE with an energy of less than about 20 eV induced by the EUV irradiation can be reduced, as compared with the case where the top portion of the ruthenium capping layer is free of the halogen element, pentavalent element or hexavalent element. This is because the electron vacancy of ruthenium in the doped top portion 20A of the capping layer 20 has already been filled by the halogen element, pentavalent element or hexavalent element.

Figure 5A:
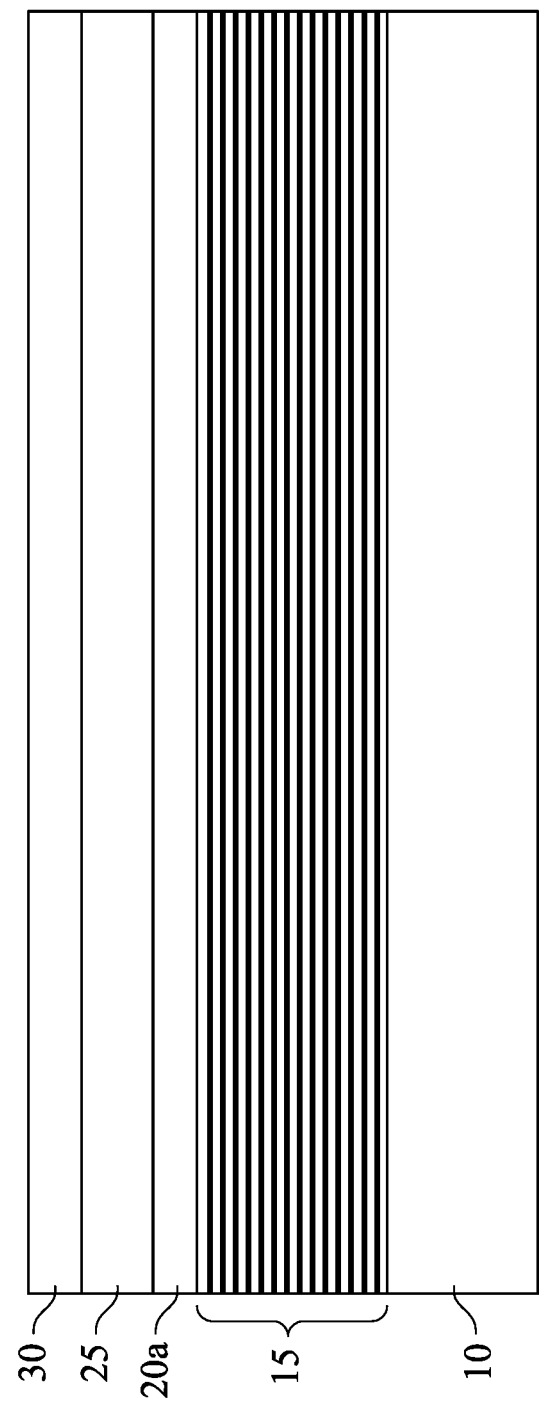
FIGS. 5A, 5B, and 5C are cross-sectional views of various stages of a process for forming an extreme ultraviolet (EUV) mask in accordance with some embodiments.
Figure 5B:
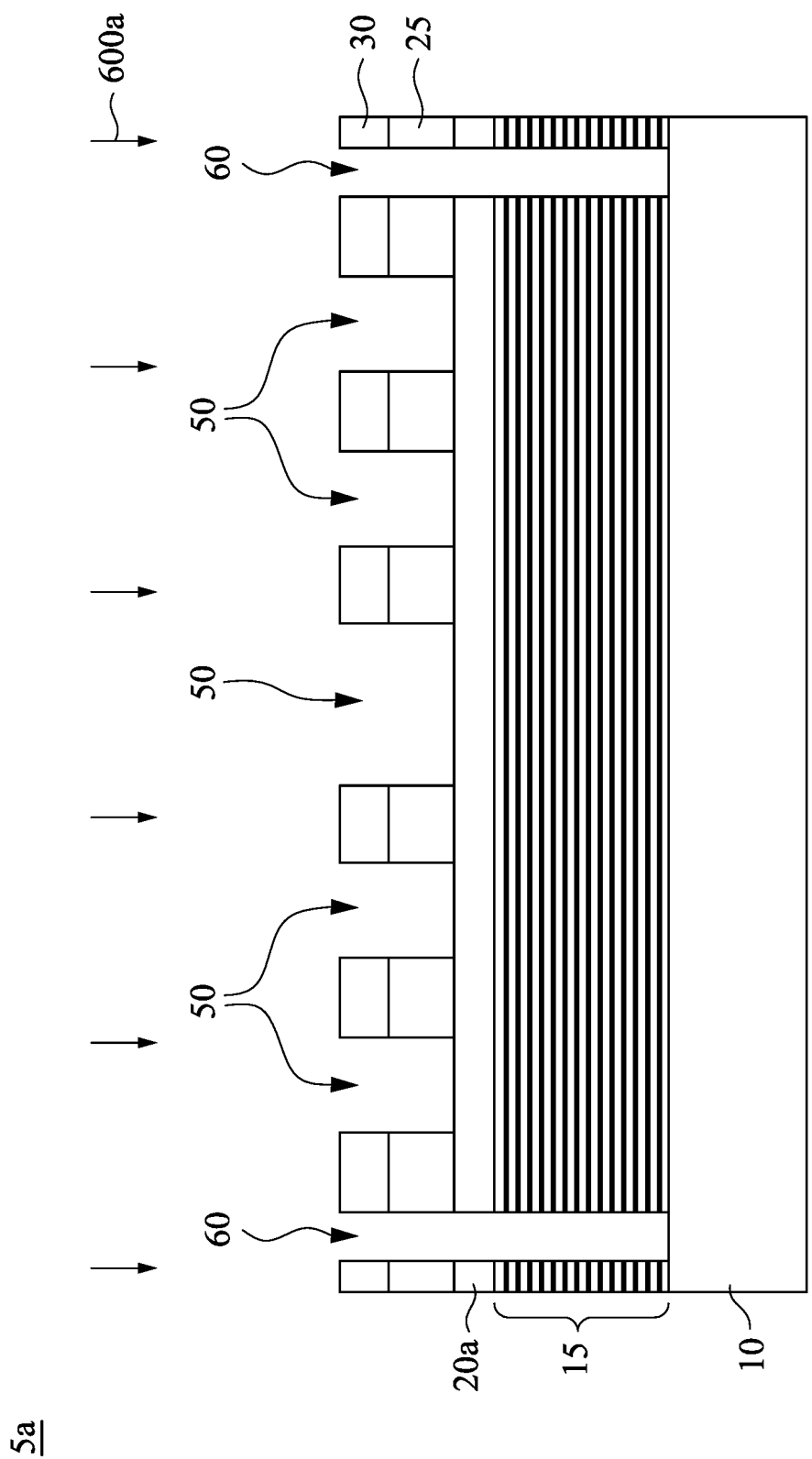
Figure 5C:
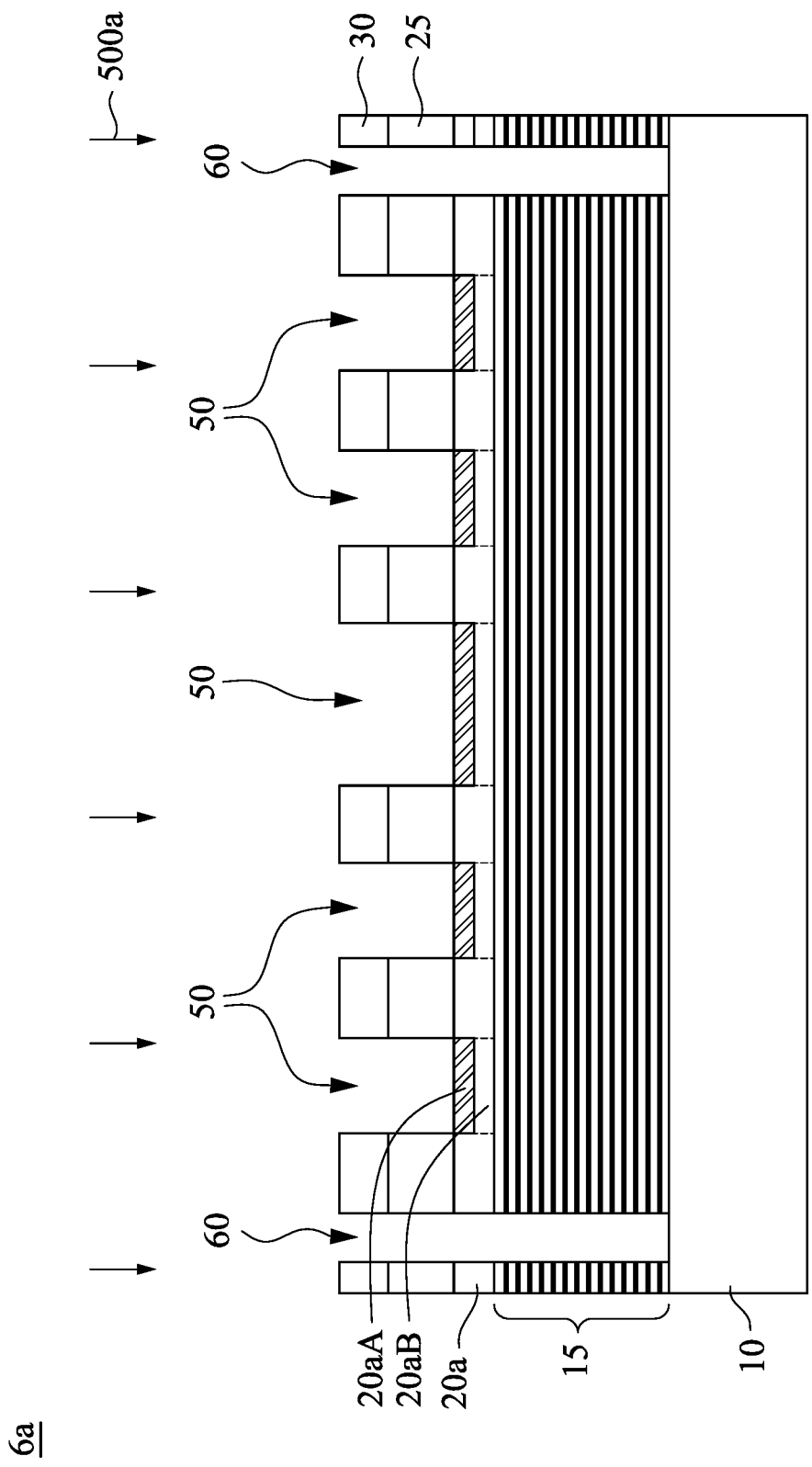

FIGS. 5A, 5B, and 5C are cross-sectional views of various stages of a process for forming an extreme ultraviolet (EUV) mask in accordance with some embodiments. Reference is made to FIG. 5A. FIG. 5A shows another EUV photo mask blank 5a similar to the EUV photo mask blank 5, except that the capping layer 20a remains un-doped prior to forming the overlying absorber layer 25, instead of doped. In greater detail, the EUV photo mask blank 5a includes a substrate 10, a Mo/Si multilayer stack 15, a capping layer 20a, an absorber layer 25 and an anti-reflection layer 30. As shown in FIG. 5A, the Mo/Si multilayer stack 15, the capping layer 20a, the absorber layer 25 and the anti-reflection layer 30 are formed over the substrate 10 in sequence using suitable methods, as discussed previously with respect to FIGS. 3A and 3C.

Reference is made to FIG. 5B. One or more circuit patterns 50 are formed on the EUV photo mask blank 5a by performing an etching step 600a to pattern the absorber layer 25 and the anti-reflection layer 30. During the etching step 600a, the absorber layer 25 and the anti-reflection layer 30 are partially removed. Therefore, a top portion of the capping layer 20a is partially exposed. In addition, a black border area 60 surrounding a circuit pattern region and penetrating to the substrate is formed. The circuit patterns 50 are formed by using one or more lithography (e.g., electron beam lithography) and etching operations. In some examples, the area in which no circuit pattern is formed is covered by an absorber layer 25 so that the EUV light is not reflected.

Reference is made to FIG. 5C. In particular, in some embodiments, a doping process 500a is performed on the top portion of the capping layer 20a exposed by the circuit patterns 50 with a dopant to form a plurality of doped top portions 20aA after performing the etching step 600a. Thus, an EUV mask 6a is formed. The bottom portions 20aB of the capping layer 20a respectively directly under the doped top portions 20aA remain substantially un-doped or have a lower doped impurity concentration than the doped top portions 20aA, and a remaining portion of the capping layer 20a covered by the absorber layer 25 remain substantially un-doped during the doping process 500a. The doping process 500a may include ion implantation or the like. In some embodiments, the dopant includes at least one non-metal element that has high electronegativity difference from ruthenium. For example, the dopant (interchangeably referred to as impurity) is a halogen element (e.g., fluorine, chlorine or the like), a pentavalent element (nitrogen or the like), or a hexavalent element (oxygen or the like). In some embodiments, the anti-reflection layer 30 and the underlying absorber layer 25 act as an implantation mask during the doping process 500a, such that the doped top portions 20aA have the same pattern as the circuit patterns 50 when viewed from above. Because the anti-reflection layer 30 is exposed during the doping process 500a, a top portion of the anti-reflection layer 30 may be unintentionally doped with the halogen element, pentavalent element or hexavalent element. In such scenarios, the top portion of the anti-reflection layer 30 has a halogen element, a pentavalent element or a hexavalent element same as that in the doped top portions 20aA of the capping layer 20a.

Once the doping process 500a is complete, the doped top portion 20aA has a second composition different from the first composition of the substantially un-doped bottom portion 20aB and of the portions of the capping layer 20a covered by the absorber layer 25. A molecular weight of the second composition is greater than a molecular weight of the first composition. The second composition includes the metal element and the doped impurity (e.g., halogen element, pentavalent element or hexavalent element). In particular, the second composition and the first composition have different chemical bonding types. In some embodiments where the first composition includes a transition metal, since the transition metal has a tendency to accept electrons, the doped impurity may react with the transition metal to form a stable coordination complex. In some embodiments where the first composition includes ruthenium, the second composition may include at least one ruthenium complex, such as $Ru_xO_{1-x}$, $Ru_xA_yO_{1-x-y}$ (where A is a halogen atom), or the like. The ruthenium forms chemical bonds (e.g., ionic bonds for halogen element) having high electronegativity difference with the halogen element, pentavalent element or hexavalent element, such that the ruthenium is in a stable state with a valence number of 16 or 18. Since the halogen element, pentavalent element or hexavalent element may fill electron vacancy in ruthenium, the unwanted cross-link between the adventitious gaseous organic compound in the EUV lithography system and the doped top portion 20aA of the capping layer 20a may be prevented.

Figure 6:
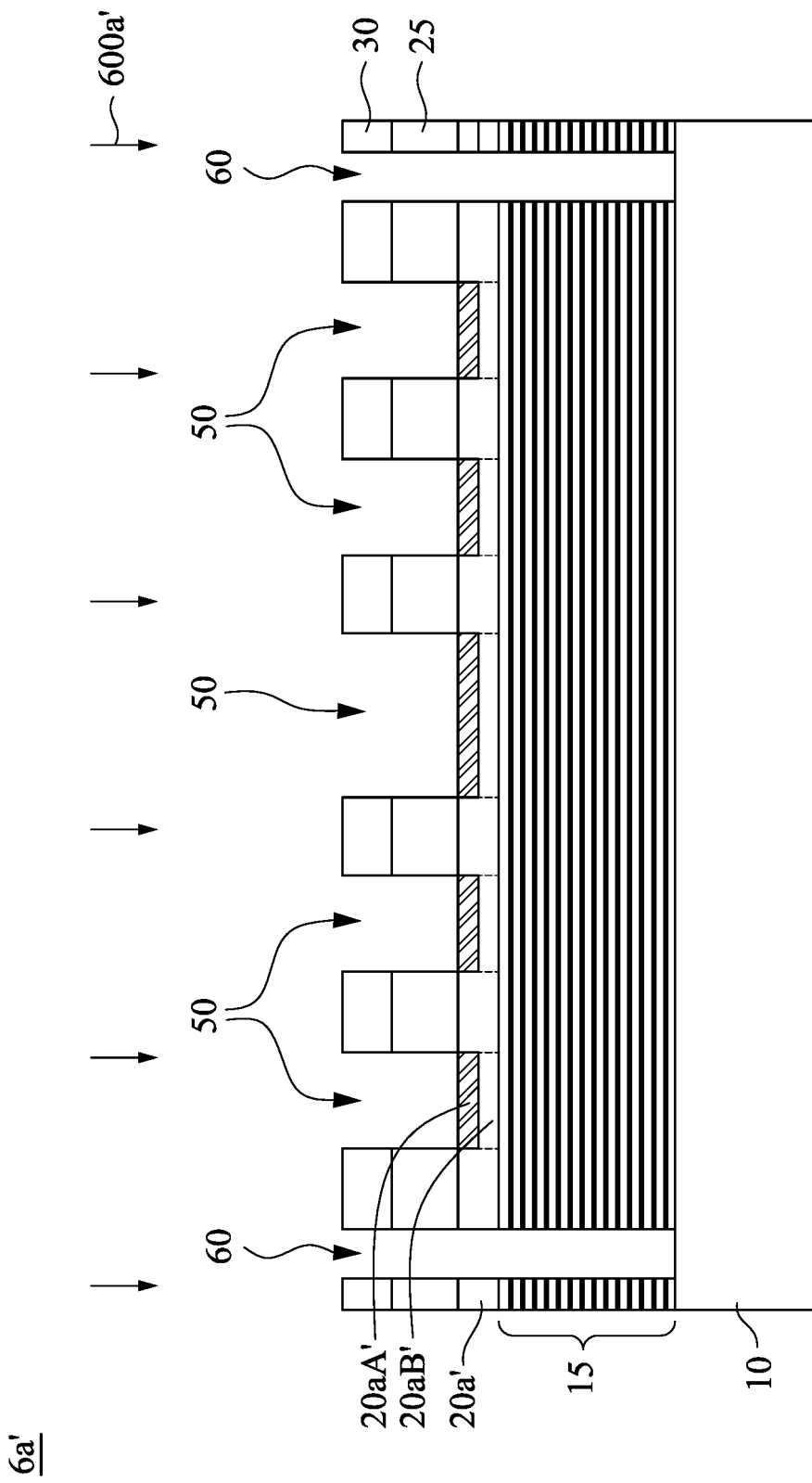
FIG. 6 is a cross-sectional view of various stages of a process for forming an extreme ultraviolet (EUV) mask in accordance with some embodiments.

FIG. 6 is a cross-sectional view of various stages of a process for forming an extreme ultraviolet (EUV) mask 6a' in accordance with some embodiments. Reference is made to FIG. 6. In some other embodiments, the top portion of the capping layer 20a' exposed by the circuit patterns 50 is in-situ doped by adding the dopant, such as nitrogen, halogen and/or oxygen, during the etching process 600a' performed on the EUV photo mask blank 5a (see FIG. 5B) to form the circuit patterns 50. In other words, the step of the etching process 600a' is performed simultaneously with in-situ doping the halogen impurity, pentavalent impurity or hexavalent impurity into the exposed top portion of the capping layer 20a'. Thus, an EUV mask 6a' is formed with circuit patterns 50 as well as the doped capping layer 20a'. By way of example and not limitation, the etching process 600a' may be performed by using an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The in-situ doping process during the etching process 600a' may be performed by introducing precursors of a halogen element (e.g., fluorine, chlorine or the like), a pentavalent element (nitrogen or the like), or a hexavalent element (oxygen or the like). Precursors of the fluorine element may include fluorine-containing gas, such as $GeF_4$, $NF_3$, $CF_4$, $C_2F_6$, $F_2$, the like, or mixtures thereof. Precursors of the chlorine element may include chlorine-containing gas, such as $Cl_2$, $CHCl_3$, $CCl_4$, $BCl_3$, the like, or mixtures thereof. Precursors of the pentavalent element (nitrogen or the like) may include, but is not limited to, ammonia ($NH_3$), dimethyl amine ($N(CH_3)_2$), dimethyl amine ($N(C_2H_5)_2$), the like, or mixtures thereof. Precursors of the hexavalent element (oxygen or the like) may include, but is not limited to, $H_2O$, $D_2O$, $O_3$, $O_2$, the like, or mixtures thereof.

The bottom portions 20aB' of the capping layer 20a' respectively directly under the doped top portions 20aA' remain substantially un-doped or have a lower doped impurity concentration than the doped top portions 20aA'. Portions of the capping layer 20a' directly under the absorber layer 30 remain substantially un-doped as well. In some embodiments, the anti-reflection layer 30 and the underlying absorber layer 25 act as an implantation mask during the in-situ doping process, such that the doped top portions 20aA' have the same pattern as the circuit patterns 50 when viewed from above. In some embodiments, a top portion of the anti-reflection layer 30 may be unintentionally doped with the halogen impurity, pentavalent impurity or hexavalent impurity. In such scenarios, the top portion of the anti-reflection layer 30 has a halogen element, a pentavalent element or a hexavalent element same as that in the doped top portions 20aA' of the capping layer 20a'.

Figure 7A:
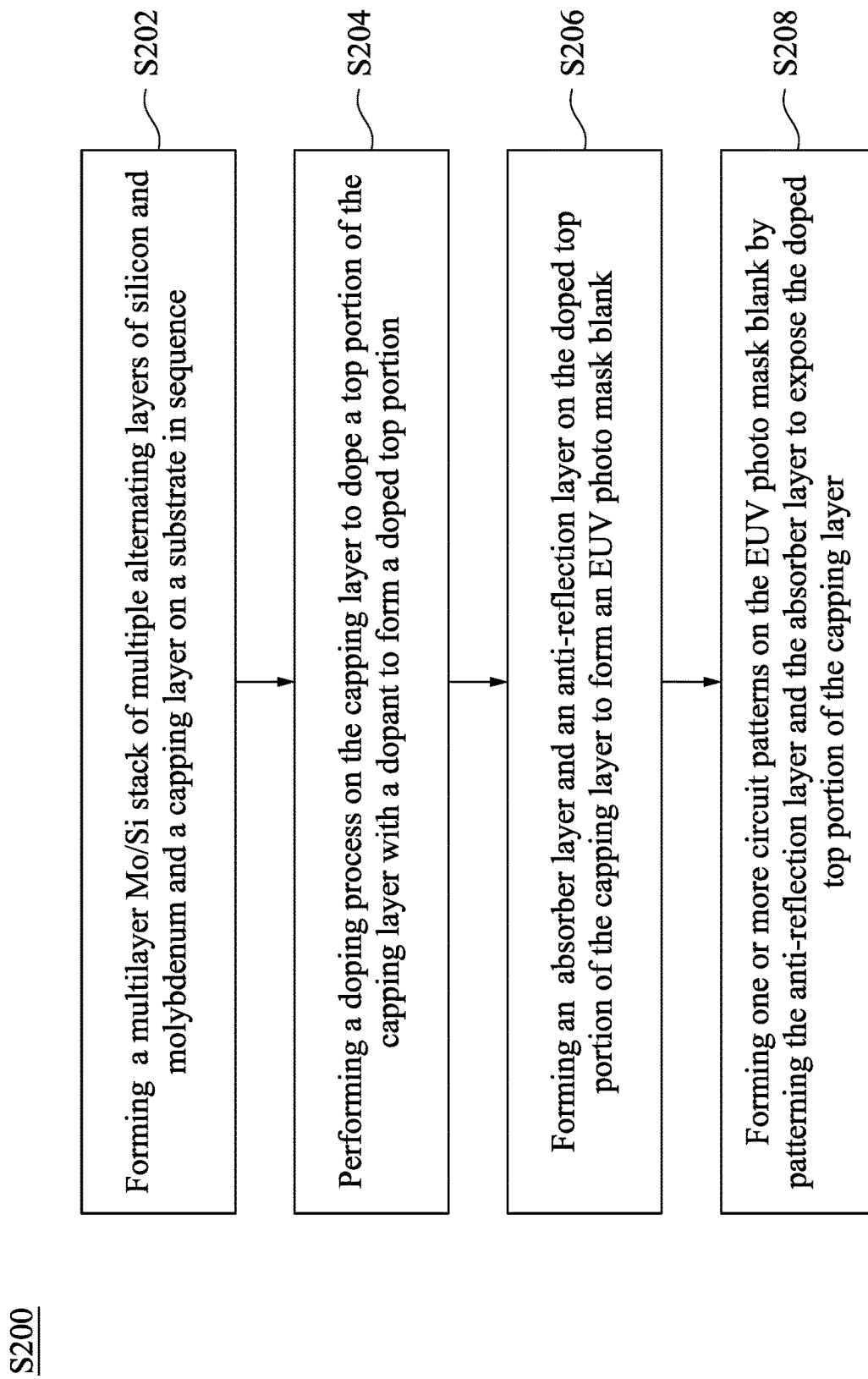
FIG. 7A shows a flowchart illustrating a method of manufacturing an EUV mask for a semiconductor manufacturing operation according to an embodiment of the present disclosure.

FIG. 7A shows a flowchart illustrating a method S200 of manufacturing an EUV mask according to some embodiments of the present disclosure. It is understood that in the sequential manufacturing process, one or more additional operations can be provided before, during, and after the stages shown in FIG. 7A and some of the operations described below can be replaced or eliminated for additional embodiments of the method. The order of the operations/processes may be interchangeable. At step S202, a multi-layer Mo/Si stack of multiple alternating layers of silicon and molybdenum and a capping layer are formed in sequence on a substrate. At step S204, a doping process is performed on the capping layer to dope a top portion of the capping layer with the halogen impurity, pentavalent impurity or hexavalent impurity to form a doped top portion. At step S206, an absorber layer formed and an anti-reflection layer are formed on the doped top portion of the capping layer to form an EUV photo mask blank. At step S208, one or more circuit patterns are formed on the EUV photo mask blank by patterning the anti-reflection layer and the absorber layer to expose the doped top portion of the capping layer.

Figure 7B:
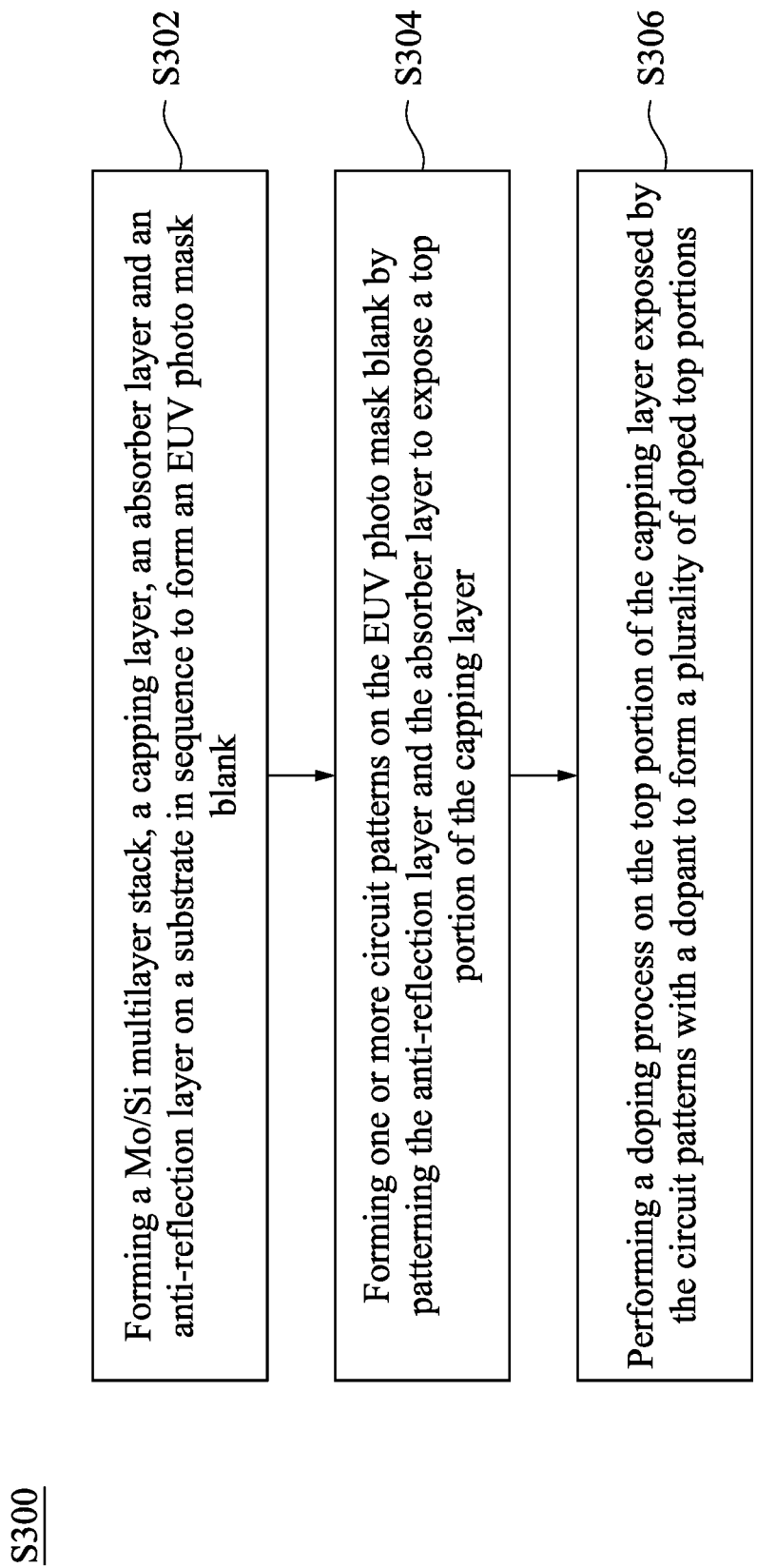
FIG. 7B shows a flowchart illustrating a method of manufacturing an EUV mask for a semiconductor manufacturing operation according to an embodiment of the present disclosure.

FIG. 7B shows a flowchart illustrating a method S300 of manufacturing an EUV mask according to some embodiments of the present disclosure. It is understood that in the sequential manufacturing process, one or more additional operations can be provided before, during, and after the stages shown in FIG. 7B and some of the operations described below can be replaced or eliminated for additional embodiments of the method. The order of the operations/processes may be interchangeable. At step S302, a Mo/Si multilayer stack, a capping layer, an absorber layer and an anti-reflection layer are formed on a substrate in sequence to form an EUV photo mask blank. At step S304, one or more circuit patterns are formed on the EUV photo mask blank by patterning the anti-reflection layer and the absorber layer. At step S306, a doping process is performed to dope the top portion of the capping layer exposed by the circuit patterns with the halogen impurity, pentavalent impurity or hexavalent impurity.

Figure 7C:
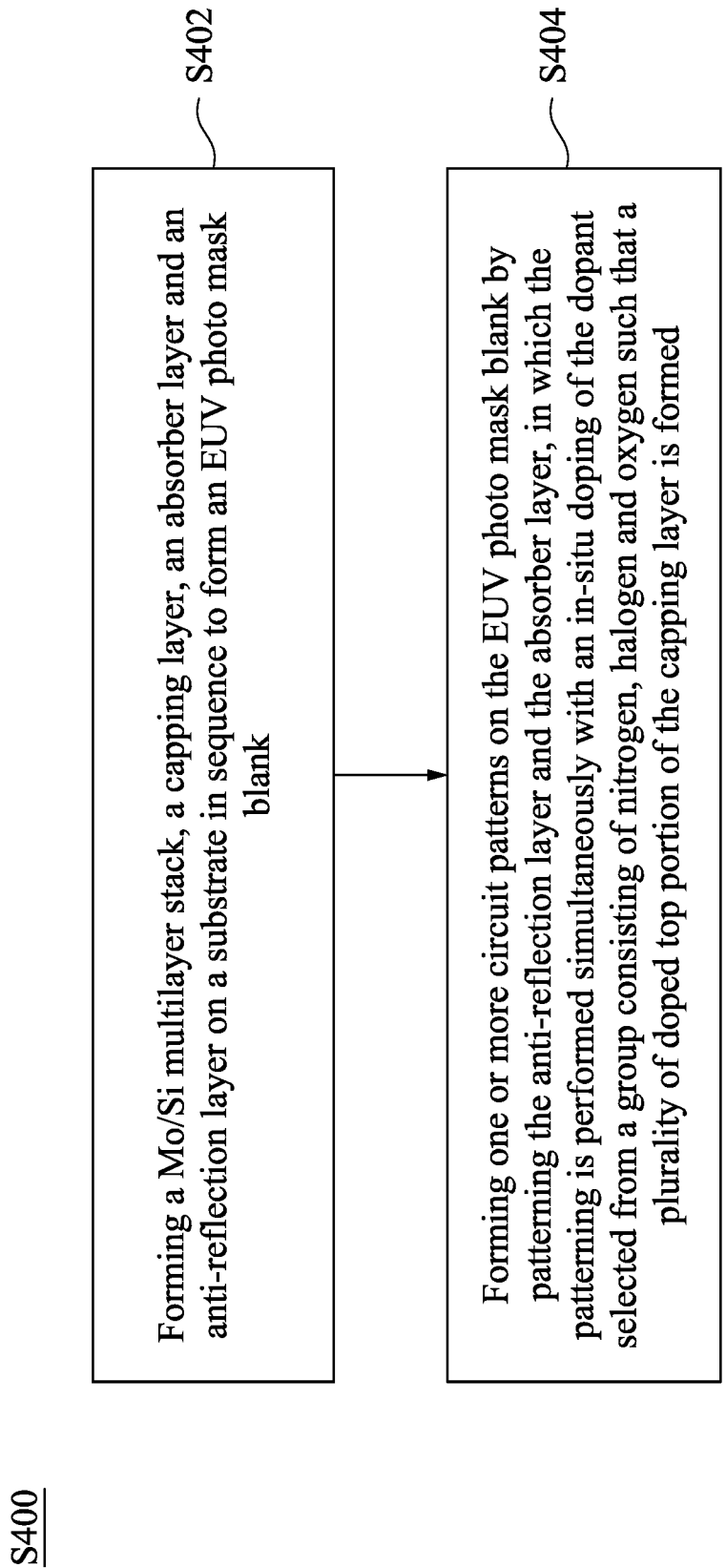
FIG. 7C shows a flowchart illustrating a method of manufacturing an EUV mask for a semiconductor manufacturing operation according to an embodiment of the present disclosure.

FIG. 7C shows a flowchart illustrating a method S400 of manufacturing an EUV mask for a semiconductor manufacturing operation according to an embodiment of the present disclosure. At step S402, a Mo/Si multilayer stack, a capping layer, an absorber layer and an anti-reflection layer are formed on a substrate in sequence to form an EUV photo mask blank. At step S404, one or more circuit patterns 50 are formed on the EUV photo mask blank by patterning the anti-reflection layer and the absorber layer, and the patterning step is performed simultaneously with in-situ doping the halogen impurity, pentavalent impurity or hexavalent impurity into the capping layer.

Figure 8:
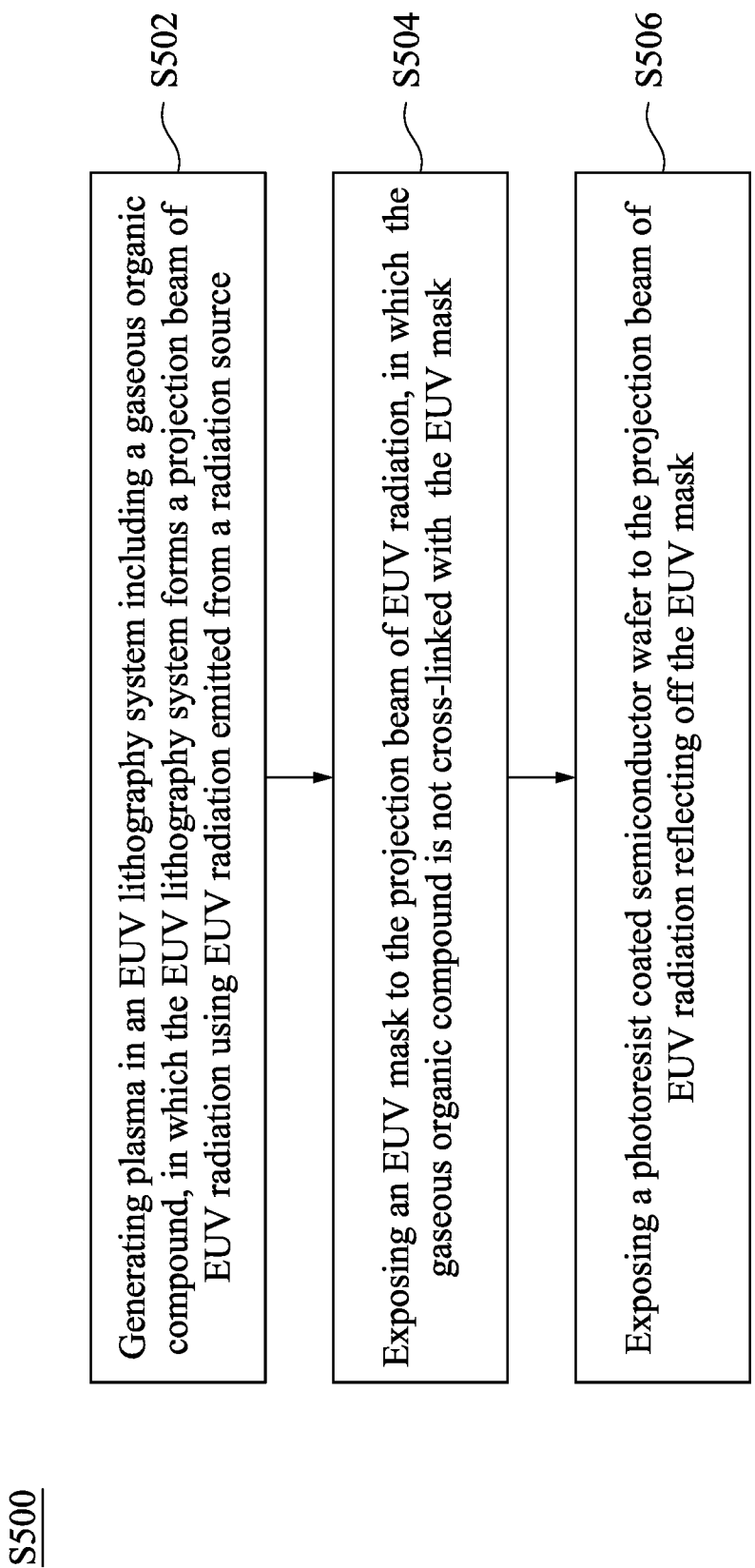
FIG. 8 shows a flowchart illustrating a method of extreme ultraviolet lithography (EUVL) according to an embodiment of the present disclosure.

FIG. 8 shows a flowchart illustrating a method S500 of extreme ultraviolet lithography (EUVL) according to an embodiment of the present disclosure. In some embodiments, the method S500 is performed by the computer system 900 of FIGS. 9A and 9B. The method S500 includes an operation S502 of generating plasma in an EUV lithography system including a gaseous organic compound. The EUV lithography system forms a projection beam of EUV radiation using EUV radiation emitted from a radiation source. In operation S504, an EUV mask is exposed to the projection beam of EUV radiation. The gaseous organic compound is not cross-linked with the EUV mask. In operation S506, a photoresist coated semiconductor wafer is exposed to the projection beam of EUV radiation reflecting off the EUV mask. Operation S502 is triggered by turning on the laser source 300 and the droplet generator 115 as illustrated in FIG. 1, and the operations S504 and S506 occur naturally once the operation S502 is triggered, as long as the optics 205a-205e are suitably oriented to direct the EUV projection beam.

Figure 9A:
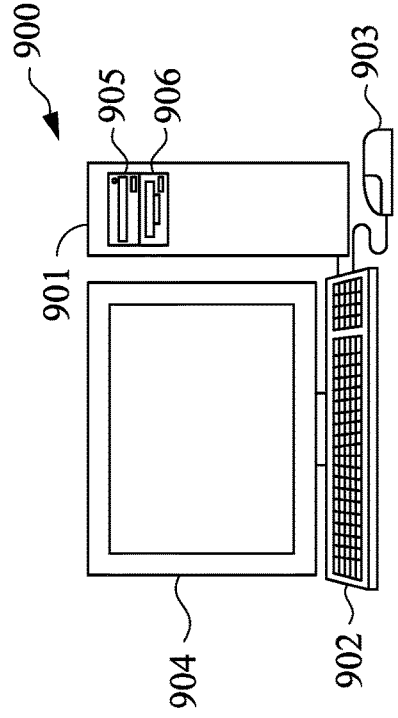
FIGS. 9A and 9B show a photo mask data generating apparatus according to an embodiment of the present disclosure.
Figure 9B:
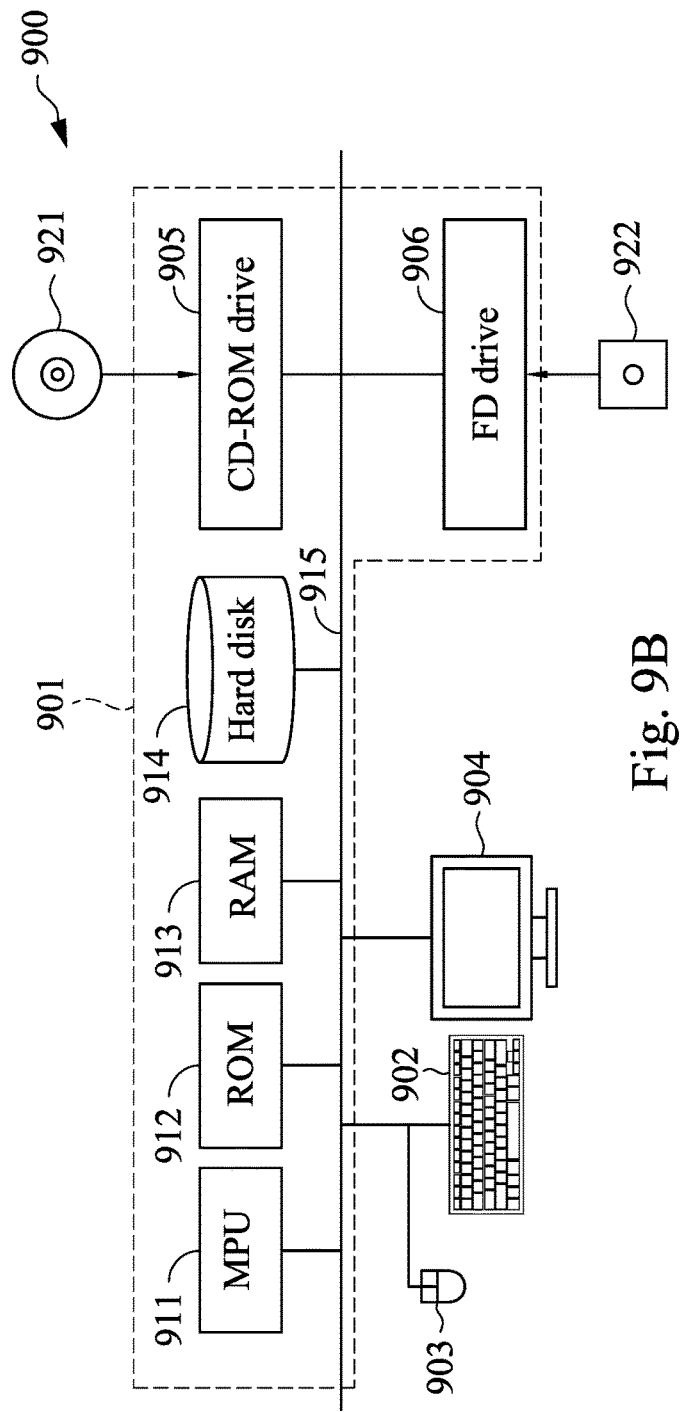

FIGS. 9A and 9B show a photo mask data generating apparatus according to an embodiment of the present disclosure. FIG. 9A is a schematic view of a computer system that executes the photo mask data generating process according to one or more embodiments as described above. All of or a part of the process, method and/or operations of the foregoing embodiments can be realized using computer hardware and computer programs executed thereon. In FIG. 9A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 9B is a diagram showing an internal configuration of the computer system 900. In FIG. 9B, the computer 901 is provided with, in addition to the optical disk drive 905 and the magnetic disk drive 906, one or more processors 911, such as a micro processing unit (MPU), a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the computer system 900 to execute the functions of the photo mask data generating apparatus in the foregoing embodiments may be stored in an optical disk 921 or a magnetic disk 922, which are inserted into the optical disk drive 905 or the magnetic disk drive 906, and transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network.

The program does not necessarily have to include, for example, an operating system (OS) or a third party program to cause the computer 901 to execute the functions of the photo mask data generating apparatus in the foregoing embodiments. The program may only include a command portion to call an appropriate function (module) in a controlled mode and obtain desired results.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs in some embodiments. Furthermore, a computer that executes the programs may be a single computer or may be multiple computers.

Further, the entirety of or a part of the programs to realize the functions of the photo mask data generating apparatus is a part of another program used for photo mask fabrication processes in some embodiments. In addition, the entirety of or a part of the programs to realize the functions of the photo mask data generating apparatus is realized by a ROM made of, for example, a semiconductor device in some embodiments.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that unwanted carbon deposition upon the ruthenium capping layer in the EUV mask can be alleviated by the doping the ruthenium capping layer with a halogen element, a pentavalent element, a hexavalent element or combinations thereof, which in turn will address the CD degradation issue in the resulting pattern formed using the EUV lithography technique. Another advantage is that the bottom portion of the ruthenium capping layer remains substantially un-doped (i.e., remaining substantially pure ruthenium), so that the capping layer can still protect the underlying Mo/Si ML structure from unwanted oxidation.

In some embodiments, a method of forming an extreme ultraviolet (EUV) mask includes forming a multilayer Mo/Si stack comprising alternating stacked Mo and Si layers over a mask substrate; forming a ruthenium capping layer over the multilayer Mo/Si stack; doping the ruthenium capping layer with a halogen element, a pentavalent element, a hexavalent element or combinations thereof; forming an absorber layer over the ruthenium capping layer; and etching the absorber layer to form a pattern in the absorber layer.

In some embodiments, an extreme ultraviolet lithography (EUVL) method includes turning on a droplet generator to eject a metal droplet toward a zone of excitation in front of a collector; turning on a laser source to emit a laser toward the zone of excitation, such that the metal droplet is heated by the laser to generate EUV radiation; guiding the EUV radiation, by using one or more first optics, toward a reflective mask in an exposure device, the reflective mask comprising a capping layer having a ruthenium complex with a ligand, the ligand having a halogen element, a pentavalent element, a hexavalent element or combinations thereof; and guiding the EUV radiation, by using one or more second optics, reflected from the reflective mask toward a photoresist coated substrate in the exposure device.

In some embodiments, an extreme ultraviolet (EUV) mask includes a multilayer Mo/Si stack, a capping layer, and a patterned absorber layer. The multilayer Mo/Si stack includes alternating stacked Mo and Si layers disposed over a mask substrate. The capping layer is on the multilayer Mo/Si stack. A top portion of the capping layer has a first composition different from a second composition of a bottom portion of the capping layer under the top portion of the capping layer. A patterned absorber layer is on the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet lithography (EUVL) method, comprising:
turning on a droplet generator to eject a metal droplet toward a zone of excitation in front of a collector;
turning on a laser source to emit a laser toward the zone of excitation, such that the metal droplet is heated by the laser to generate EUV radiation;
guiding the EUV radiation, by using one or more first optics, toward a reflective mask in an exposure device, the reflective mask comprising a capping layer having a ruthenium complex with a ligand, the ligand having a halogen element, a pentavalent element, a hexavalent element or combinations thereof; and
guiding the EUV radiation, by using one or more second optics, reflected from the reflective mask toward a photoresist coated substrate in the exposure device.

2. The method of claim 1, wherein the capping layer of the reflective mask is not cross-linked with a hydrocarbon-containing gas in the exposure device during generating the EUV radiation.

3. The method of claim 2, wherein the hydrocarbon-containing gas further exists in a chamber in which the collector is located.

4. The method of claim 2, wherein the hydrocarbon-containing gas is dissociated by the EUV radiation.

5. The method of claim 1, wherein a bottom portion of the capping layer of the reflective mask is free of the ruthenium complex.

6. The method of claim 1, wherein the reflective mask further comprises a multilayer Mo/Si stack in contact with a portion of the capping layer that is free of the ruthenium complex.

7. The method of claim 1, wherein the reflective mask further comprises an anti-reflection layer, and a top portion of the anti-reflection layer is doped with the halogen element, the pentavalent element or the hexavalent element.

8. An extreme ultraviolet lithography (EUVL) method, comprising:
turning on a droplet generator to eject a metal droplet toward a zone of excitation in front of a collector;
turning on a laser source to emit a laser toward the zone of excitation, such that the metal droplet is heated by the laser to generate EUV radiation;
guiding the EUV radiation, by using one or more first optics, toward a reflective mask in an exposure device, the reflective mask comprising:
a multilayer Mo/Si stack comprising alternating Mo and Si layers over a mask substrate;
a capping layer on the multilayer Mo/Si stack, wherein the capping layer has a doped top portion and an un-doped bottom portion; and
a patterned layer on the capping layer; and
guiding the EUV radiation, by using one or more second optics, reflected from the reflective mask toward a photoresist coated substrate in the exposure device.

9. The method of claim 8, wherein the doped top portion has dopants including at least one nonmetal element that has electronegativity difference from ruthenium.

10. The method of claim 8, wherein the doped top portion has dopants including a halogen element, a pentavalent element, or a hexavalent element.

11. The method of claim 8, wherein the capping layer further has an un-doped top portion in contact with a lateral surface of the doped top portion.

12. The method of claim 11, wherein the patterned layer covers the un-doped top portion without covering the doped top portion.

13. The method of claim 8, wherein the doped top portion of the capping layer of the reflective mask is not cross-linked with a hydrocarbon-containing gas in the exposure device during generating the EUV radiation.

14. The method of claim 8, wherein the reflective mask further comprises an anti-reflection layer, and the anti-reflection layer and the doped top region have the same dopants.

15. An extreme ultraviolet lithography (EUVL) method, comprising:
turning on a droplet generator to eject a metal droplet toward a zone of excitation in front of a collector;
turning on a laser source to emit a laser toward the zone of excitation, such that the metal droplet is heated by the laser to generate EUV radiation;
guiding the EUV radiation, by using one or more first optics, toward a reflective mask in an exposure device, the reflective mask comprising:
a multilayer Mo/Si stack comprising alternating Mo and Si layers over a mask substrate;
a capping layer on the multilayer Mo/Si stack;
a patterned layer on the capping layer, wherein the capping layer has a first top region exposed by the patterned layer and a second top region covered by the patterned layer, the first top region has a first composition having a first chemical bonding type, the second top region has a second composition having a second chemical bonding type different from the first chemical bonding type; and
guiding the EUV radiation, by using one or more second optics, reflected from the reflective mask toward a photoresist coated substrate in the exposure device.

16. The method of claim 15, wherein the first composition includes ruthenium, and the second composition includes at least one ruthenium complex.

17. The method of claim 16, wherein the at least one ruthenium complex includes $Ru_xO_{1-x}$, $Ru_xN_{1-x}$, $Ru_xA_yO_{1-x-y}$, and A is a halogen atom.

18. The method of claim 15, wherein a molecular weight of the second composition is greater than a molecular weight of the first composition.

19. The method of claim 15, wherein the capping layer further comprises a bottom region directly under the first top region being substantially un-doped.

20. The method of claim 15, wherein the capping layer further comprises a bottom region directly under the first top region having a doped impurity concentration than a doped impurity concentration of the first top region.

* * * * *